United States Patent
Chung et al.

(10) Patent No.: US 7,750,385 B2
(45) Date of Patent: Jul. 6, 2010

(54) SEMICONDUCTOR INTERCONNECTION STRUCTURES AND CAPACITORS INCLUDING POLY-SIGE LAYERS AND METAL CONTACT PLUGS

(75) Inventors: Eun-ae Chung, Seoul (KR); Ki-sun Kim, Seoul (KR); Young-sun Kim, Suwon-si (KR); Jin-tae Noh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/842,320

(22) Filed: Aug. 21, 2007

(65) Prior Publication Data

US 2008/0048291 A1    Feb. 28, 2008

(30) Foreign Application Priority Data

Aug. 25, 2006   (KR) ...................... 10-2006-0081179

(51) Int. Cl.
*H01L 27/108* (2006.01)
(52) U.S. Cl. ...................... 257/296; 438/396
(58) Field of Classification Search ................ 257/296, 257/303, 306, E27.048, E27.071; 438/253, 438/396
See application file for complete search history.

(56) References Cited

U.S. PATENT DOCUMENTS

| | | | |
|---|---|---|---|
| 6,121,086 A * | 9/2000 | Kuroda et al. ............... | 438/256 |
| 7,034,353 B2 * | 4/2006 | Thakur et al. ............... | 257/309 |
| 7,153,750 B2 | 12/2006 | Chung et al. | |
| 2005/0017286 A1 * | 1/2005 | Yeo et al. ..................... | 257/310 |
| 2005/0208718 A1 | 9/2005 | Lim et al. | |
| 2006/0046380 A1 | 3/2006 | Choi et al. | |
| 2006/0097299 A1 | 5/2006 | Ahn et al. | |

FOREIGN PATENT DOCUMENTS

| | | |
|---|---|---|
| KR | 10-0538096 B1 | 9/2005 |
| KR | 10-2006-0019011 A | 3/2006 |
| KR | 10-2006-0035392 A | 4/2006 |

* cited by examiner

*Primary Examiner*—David Vu
(74) *Attorney, Agent, or Firm*—Myers Bigel Sibley & Sajovec

(57) ABSTRACT

A semiconductor device includes a lower electrode of a capacitor, a dielectric layer disposed on the lower electrode, and an upper electrode of the capacitor disposed on the dielectric layer. The upper electrode includes a doped poly-$Si_{1-x}Ge_x$ layer. An interlayer insulating layer is disposed on the doped poly-$Si_{1-x}Ge_x$ layer and has a contact hole partially exposing the doped poly-$Si_{1-x}Ge_x$ layer. A metal contact plug is in the contact hole and an interconnection layer is disposed on the interlayer insulating layer and connected to the metal contact plug. Related interconnection structures and fabrication methods are also disclosed.

4 Claims, 11 Drawing Sheets

SEMICONDUCTOR INTERCONNECTION STRUCTURES AND CAPACITORS INCLUDING POLY-SIGE LAYERS AND METAL CONTACT PLUGS

CROSS-REFERENCE TO RELATED PATENT APPLICATION

This application claims the benefit under 35 USC §119 of Korean Patent Application No. 10-2006-0081179, filed on Aug. 25, 2006, the disclosure of which is hereby incorporated herein by reference in its entirety as if set forth fully herein.

FIELD OF THE INVENTION

The present invention relates to semiconductor devices and methods of fabricating the same and, more particularly, to capacitors and interconnection structures and methods of fabricating the same.

BACKGROUND OF THE INVENTION

Capacitors are widely used in many integrated circuit semiconductor devices. For example, capacitors are used to store data in Dynamic Random Access Memory (DRAM) devices. As is well known to those having skill in the art, an integrated circuit capacitor includes a first, lower or bottom electrode, a second, top or upper electrode, and a dielectric layer therebetween.

As semiconductor devices become more highly integrated, the cell size of a DRAM may decrease along with the effective area of a lower electrode of a cell capacitor. However, a predetermined amount of cell capacitance may be desirable. In order to obtain a high cell capacitance in a small area, it may be desirable to employ a high-k dielectric layer, formed of a material such as $Al_2O_3$ or $Al_2O_3/HfO_2$, which has several to several hundred times the dielectric constant of an oxide/nitride/oxide (ONO) layer that is conventionally used as a capacitor dielectric layer.

However, a doped polysilicon (poly-Si) electrode, which is conventionally used as a capacitor upper electrode or capacitor lower electrode, may react with a high-k dielectric layer and degrade the electrical characteristics of the capacitor. In order to reduce or prevent this problem, a low-k dielectric layer, such as a SiON layer, can be additionally coated between the doped poly-Si electrode and the high-k dielectric layer. In this case, however, the thickness of the capacitor dielectric layer may substantially increase.

In another method, one or both of the upper and lower electrodes of a capacitor using a high-k dielectric layer may be formed of a metal layer, which generally is less reactive than a poly-Si layer. The metal layer may be a metal or a conductive oxide or conductive nitride of a metal. In comparison with a semiconductor-insulator-semiconductor (SIS) capacitor including upper and lower electrodes formed of doped poly-Si, a capacitor including a metal upper electrode and a poly-Si lower electrode may be referred to as a metal-insulator-semiconductor (MIS) capacitor, and a capacitor including metal upper and lower electrodes may be referred to as a metal-insulator-metal (MIM) capacitor.

However, the metal upper electrode may not readily function as a resistor layer for delaying signals, due to its low resistivity. For this reason, a double layer formed by stacking a doped poly-Si layer on a metal layer may be used as an upper electrode. Here, the doped poly-Si layer may be formed by depositing an amorphous silicon (a-Si) layer using a low-pressure chemical vapor deposition (LPCVD) process and annealing the a-Si layer to activate the a-Si layer. However, the annealing process can lead to a higher leakage current than when the upper electrode is formed of only a metal layer.

FIG. 1 is a graph illustrating the higher leakage current due to annealing of an n-type doped poly-Si layer for activation in a conventional MIS capacitor. In FIG. 1, (a) denotes the leakage current of an MIS capacitor including an upper electrode formed of only a TiN layer, which was not annealed. Also in FIG. 1, (b) denotes the leakage current of an MIS capacitor including an upper electrode formed of a double layer obtained by stacking an n-type doped poly-Si layer on a TiN layer. The n-type doped poly-Si layer was deposited using an LPCVD process at a temperature of 530° C. and annealed in a furnace under an $N_2$ atmosphere at a temperature of 600° C. for 30 minutes.

From FIG. 1, it can be seen that in case (b) where the annealing process for activation was performed, the leakage current and gate oxide thickness (Tox) were larger than those in case (a). Therefore, a low thermal budget process may be desired by changing the current annealing conditions of the n-type doped poly-Si layer where an annealing process is performed in a furnace at a temperature of 600° C. for 30 minutes or at a temperature 650° C. for 2 minutes. When fabricating a highly integrated DRAM cell, it may therefore be desirable to use only low-temperature processes after depositing a high-k dielectric layer, irrespective of the kind of electrode, to compensate for the poor thermal stability of the high-k dielectric layer and reduce the leakage current of a capacitor.

SUMMARY OF THE INVENTION

According to some embodiments of the present invention, a semiconductor interconnection structure includes a poly-$Si_{1-x}Ge_x$ layer wherein $0.1 \leq x \leq 0.7$. An interlayer insulating layer is disposed on the poly-$Si_{1-x}Ge_x$ layer and has a contact hole partially exposing the poly-$Si_{1-x}Ge_x$ layer. A metal contact plug is in the contact hole of the interlayer insulating layer. An interconnection layer is disposed on the interlayer insulating layer remote from the metal contact plug and is also connected to the metal contact plug.

In other embodiments, $0.15 \leq x \leq 0.6$. Also, the poly-$Si_{1-x}Ge_x$ layer may be formed at 550° C. or lower, and in some embodiments between 350° C. and 500° C.

Other embodiments of the present invention provide a semiconductor device including a capacitor. The semiconductor device includes a lower electrode of the capacitor and a dielectric layer disposed on the lower electrode. An upper electrode of the capacitor is disposed on the dielectric layer and includes a doped poly-$Si_{1-x}Ge_x$ layer wherein $0 < x < 1$. An interlayer insulating layer is disposed on the doped poly-$Si_{1-x}Ge_x$ layer and has a contact hole partially exposing the doped poly-$Si_{1-x}Ge_x$ layer. A metal contact plug is in the contact hole. An interconnection layer is disposed on the interlayer insulating layer remote from the metal contact plug and is also connected to the metal contact plug.

The lower electrode may be formed of a polysilicon layer and/or a metal layer. The dielectric layer may be an $HfO_2$ layer, an $Al_2O_3$ layer, an $Al_2O_3/HfO_2$ layer, an $HfO_2/Al_2O_3$ layer, a $ZrO_2$ layer, a $ZrO_2/Al_2O_3$ layer, a lanthanide oxide layer, a $SrTiO_3$ layer and/or a $(Ba, Sr)TiO_3$ layer.

Also, the upper electrode may include a metal layer disposed on the dielectric layer and may comprise TiN, WN, TaN, Cu, W, Al, a noble metal and/or a noble metal oxide, and the doped poly-$Si_{1-x}Ge_x$ layer is disposed on the metal layer. In some embodiments, $0.1 \leq x \leq 0.7$. In other embodiments, $0.15 \leq x \leq 0.6$.

Yet other embodiments of the present invention provide methods of fabricating semiconductor devices including a capacitor. These methods include forming a lower electrode of the capacitor. A dielectric layer is formed on the lower electrode. An upper electrode of the capacitor is formed on the dielectric layer. The upper electrode includes a doped poly-$Si_{1-x}Ge_x$ layer wherein $0<x<1$. A planarized interlayer insulating layer is formed on the upper electrode. A portion of the interlayer insulating layer is etched to form a contact hole partially exposing the doped poly-$Si_{1-x}Ge_x$ layer. A metal contact plug is formed on the contact hole. An interconnection layer which is connected to the metal contact plug is formed.

The doped poly-$Si_{1-x}Ge_x$ layer may be formed by doping an n-type dopant and/or a p-type dopant in-situ. The doped poly-$Si_{1-x}Ge_x$ layer may be deposited at 550° C. or lower, and in some embodiments between 350° C. and 500° C. After depositing the doped poly-$Si_{1-x}Ge_x$ layer, annealing the doped poly-$Si_{1-x}Ge_x$ layer to activate the poly-$Si_{1-x}Ge_x$ layer may not be performed. Alternatively, after depositing the doped poly-$Si_{1-x}Ge_x$ layer, the doped poly-$Si_{1-x}Ge_x$ layer may be annealed at 400° C. to 550° C. to activate the doped poly-$Si_{1-x}Ge_x$ layer.

BRIEF DESCRIPTION OF THE DRAWINGS

The above and other features and advantages of the present invention will become more apparent by describing in detail various embodiments thereof with reference to the attached drawings in which.

DETAILED DESCRIPTION OF THE INVENTION

Figure 1:
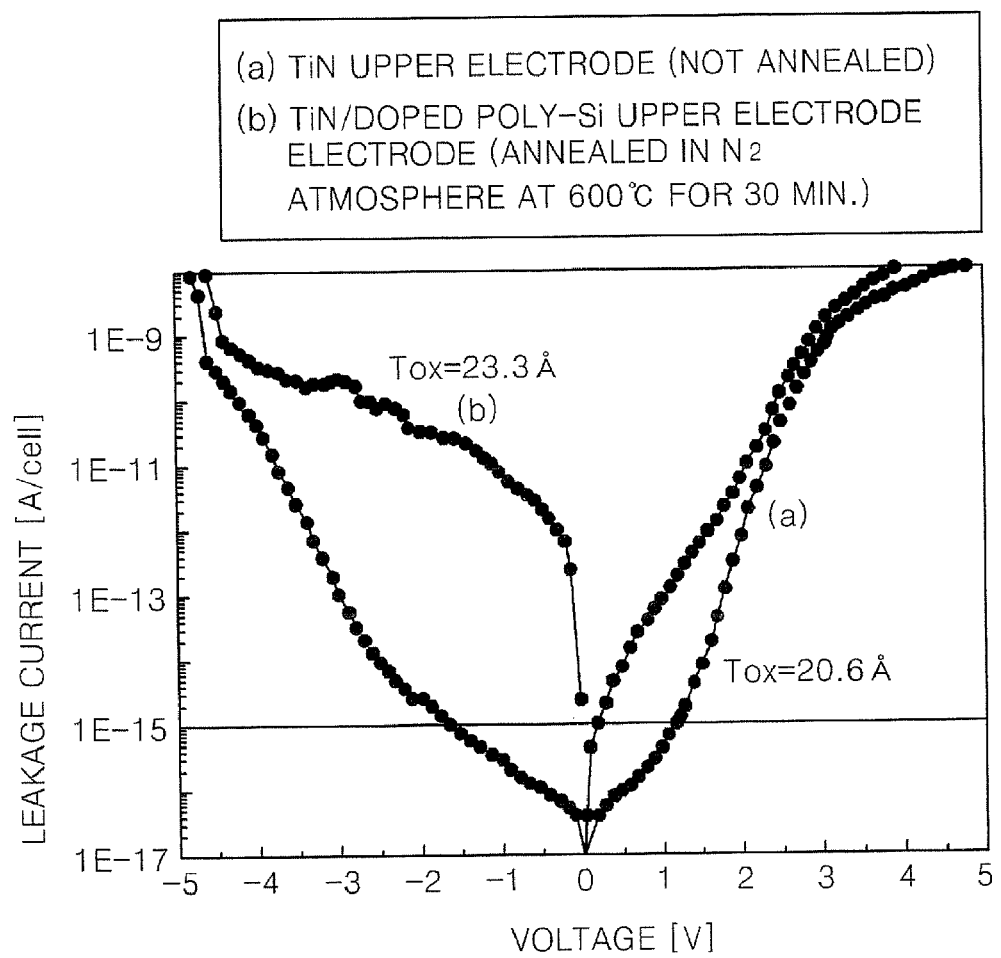
FIG. 1 is a graph illustrating a higher leakage current characteristic due to annealing of an n-type doped polysilicon layer for activation in a conventional metal-insulator-semiconductor (MIS) capacitor.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. In contrast, the term "directly" means that there are no intervening elements. As used herein, the term "and/or" includes any and all combinations of one or more of the associated listed items.

It will be understood that, although the terms first, second, etc. may be used herein to describe various embodiments, elements, components, regions, layers and/or sections, these embodiments, elements, components, regions, layers and/or sections should not be limited by these terms. These terms are only used to distinguish one embodiment, element, component, region, layer or section from another region, layer or section. Thus, a first embodiment, region, layer or section discussed below could be termed a second embodiment, region, layer or section, and, similarly, a second embodiment, region, layer or section could be termed a first embodiment, region, layer or section without departing from the teachings of the present invention.

Spatially relative terms, such as "beneath," "below," "lower," "above," "upper," "top," "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes," "including," "have" and/or "having" when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the invention may arise from recognition that, after an interlayer insulating layer formed on an upper electrode of a DRAM capacitor is etched to form a contact hole, the contact hole is filled with a metal layer to form a metal contact plug so that the upper electrode can be electrically connected to a metal interconnection formed over the upper electrode. In this case, it may be desirable for the upper electrode to function as an etch stop layer during the etching process for forming the contact hole, to give the contact hole a good etched profile.

Some embodiments of the present invention can provide semiconductor interconnection structures in which a contact hole has a good etched profile. Also, some embodiments of the present invention can provide semiconductor devices including a capacitor, which can reduce or prevent thermal degradation of a dielectric layer to allow improved leakage current of the capacitor and to allow a contact hole to have a good etched profile, and methods of fabricating the same.

FIGS. 2 through 9 are cross sectional views illustrating semiconductor interconnection structures and capacitors and methods of fabricating the same according to various embodiments of the present invention. In some embodiments, the capacitor is a metal-insulator-semiconductor (MIS) capacitor including a lower electrode formed of a doped poly-Si layer and an upper electrode formed of a TiN layer and an n-type or p-type doped poly-$Si_{1-x}Ge_x$ layer.

Figure 2:
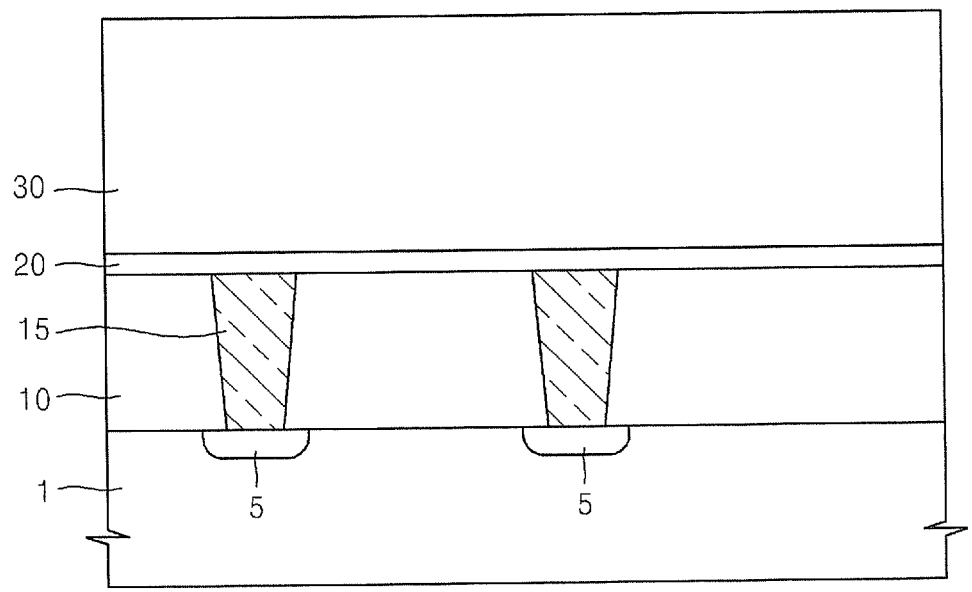
FIGS. 2 through 9 are cross-sectional views illustrating semiconductor interconnection structures and MIS capacitor structures and methods of fabricating the same according to various embodiments of the present invention.

Referring to FIG. 2, a lower insulating layer 10 is formed on a substrate 1, and a plurality of contact plugs 15 are formed through the lower insulating layer 10 to contact impurity regions 5 formed in the substrate 1. An etch stop layer 20 and a mold oxide layer 30 are sequentially formed on the contact plug 15 and the lower insulating layer 10. The etch stop layer 20 may be formed of, for example, silicon nitride. The mold oxide layer 30 may be formed of boron phosphorus silicate glass (BPSG), phosphorus silicate glass (PSG), plasma-enhanced tetra ethyl ortho silicate (PE-TEOS) and/or high-density-plasma (HDP) oxide.

Figure 3:
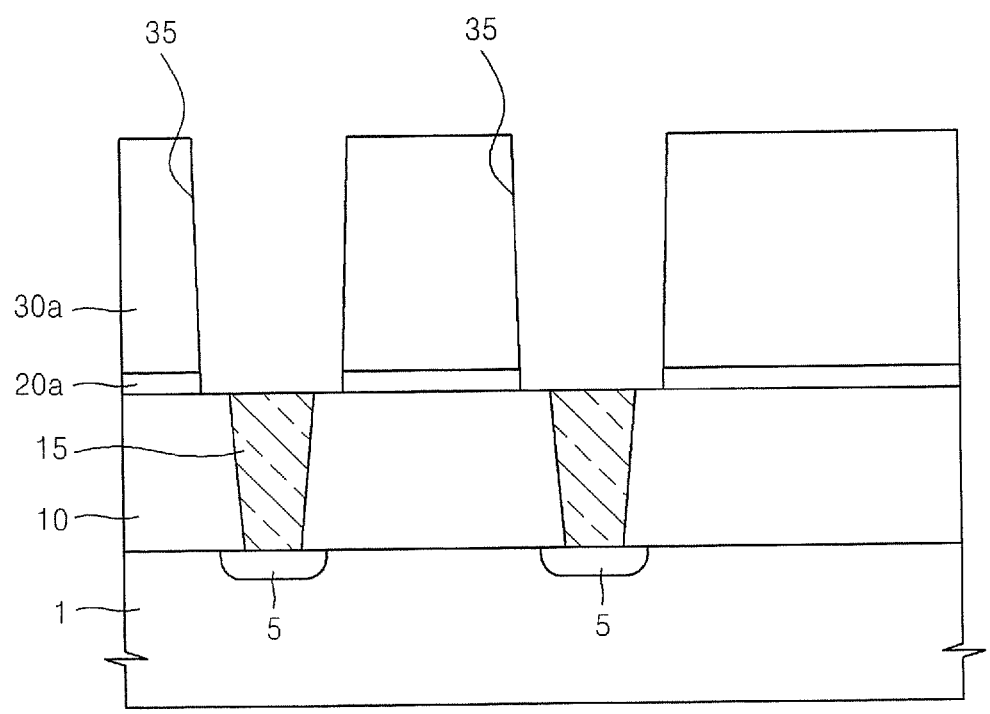

Referring to FIG. 3, the mold oxide layer 30 is etched until the top surface of the etch stop layer 20 is exposed, thereby forming a mold oxide layer pattern 30a. In this case, the etch stop layer 20 reduces or prevents the lower insulating layer 10 from being etched. Thereafter, an etching process is performed to remove only the exposed portion of the etch stop layer 20, to form a hole 35 exposing the contact plug 15 and the top surface of the lower insulating layer 10 adjacent to the contact plug 15. An etch stop layer pattern 20a remains under the mold oxide layer pattern 30a.

Figure 4:
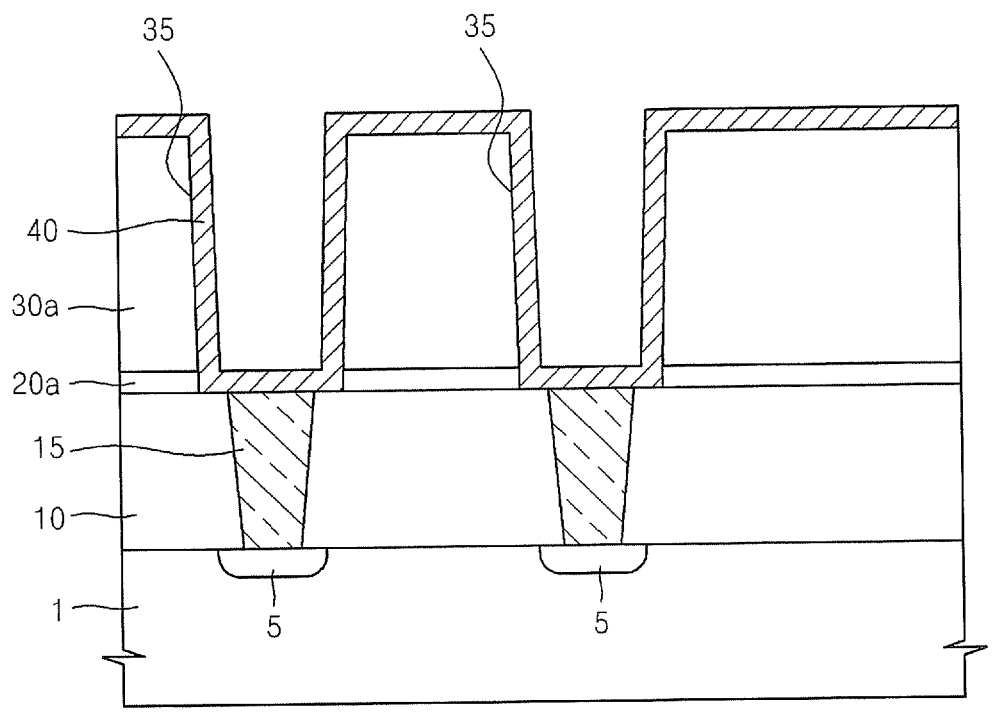

Referring to FIG. 4, a doped poly-Si layer 40 is formed to partially fill the hole 35. The doped poly-Si layer 40 will later constitute a lower electrode of a capacitor. The doped poly-Si layer 40 may be formed using a chemical vapor deposition (CVD) process and/or an atomic layer deposition (ALD) process to obtain good step coverage. For instance, the formation of an n-type doped poly-Si layer 40 may include depositing a poly-Si layer using an ordinary low-pressure CVD (LPCVD) process and doping $PH_3$ ions into the poly-Si layer to provide high resistivity.

Figure 5:
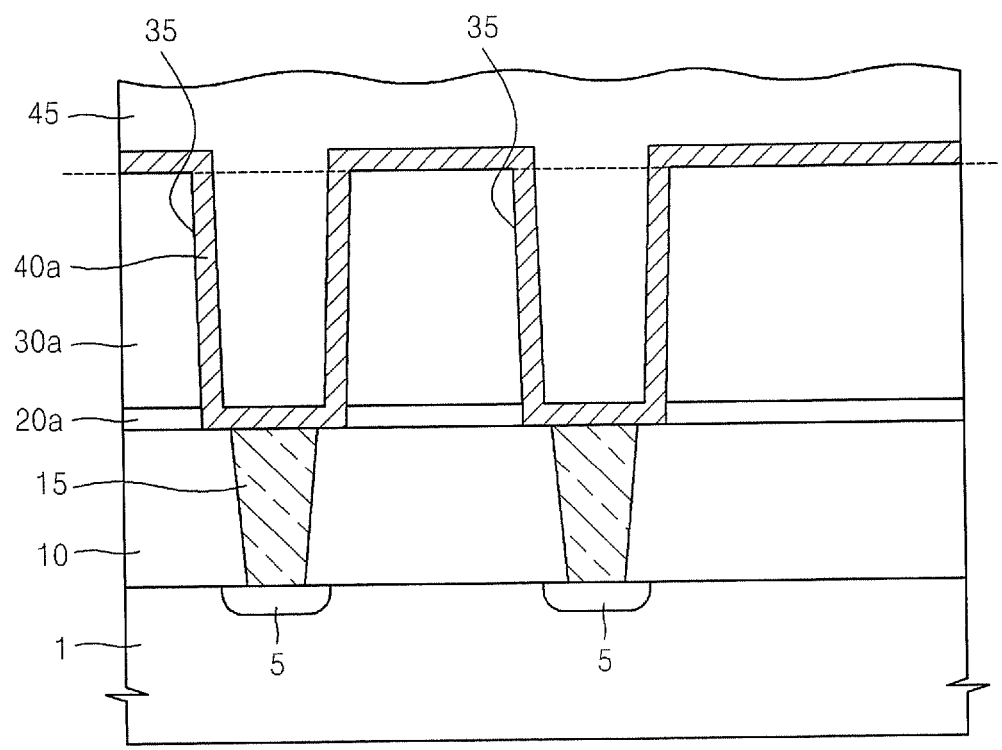

Referring to FIG. 5, a gap filling layer 45 having good gap filling characteristics is deposited on the doped poly-Si layer 40 to fill the hole 35. For example, an undoped silicate glass (USG) layer may be used as the gap filling layer 45. Next, portions of the gap filling layer 45 and the doped poly-Si layer 40 illustrated with a dotted line are removed using an etch-back process and/or a chemical mechanical polishing (CMP) process until the top surface of the mold oxide layer pattern 30a is exposed. Thus, cylindrical capacitor lower electrodes 40, which are separated from one another, are formed.

Figure 6:
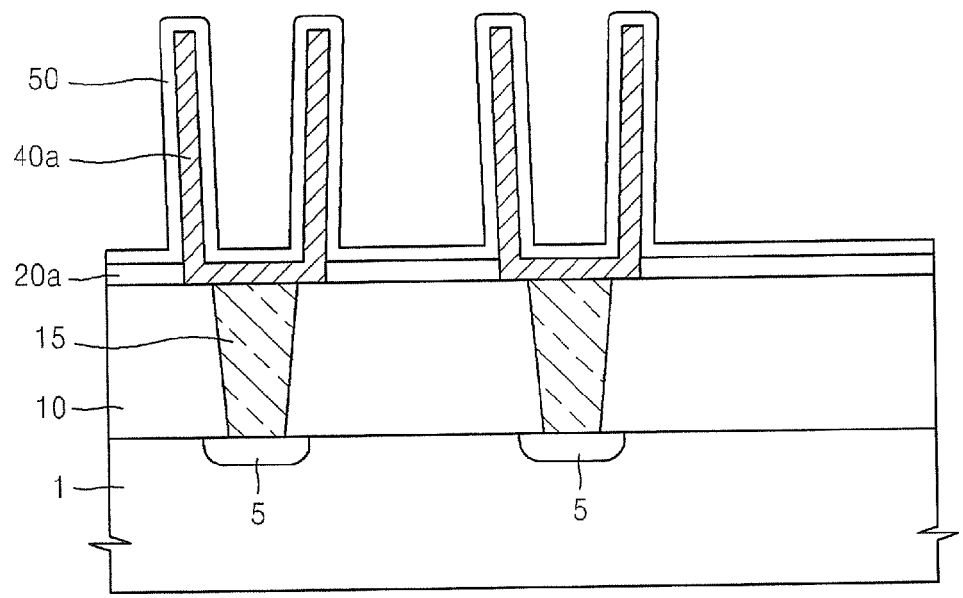

Referring to FIG. 6, the gap filling layer 45 and the mold oxide layer pattern 30a are removed using a wet etching process to expose the surface of the lower electrode 40a, and a dielectric layer 50 is formed on the exposed surface of the lower electrode 40a. Before forming the dielectric layer 40, a plasma nitridation process and/or thermal nitridation process using $NH_3$ gas may be performed on the surface of the lower electrode 40a if desired. As a result, a silicon nitride layer with thickness of 10 Å to 20 Å may be formed on the surface of the lower electrode 40a, thereby preventing a reaction between the lower electrode 40a and the dielectric layer 50.

For example, the dielectric layer 50 may be an $HfO_2$ layer, an $Al_2O_3$ layer and/or an $Al_2O_3/HfO_2$ layer. The dielectric layer 50 may be formed using a CVD process and/or an ALD process to obtain reliable step coverage. In particular, when the ALD process is used, the dielectric layer 50 can be deposited at 300° C. After depositing the dielectric layer 40, an additional treatment process may be further performed to improve the electrical characteristics of the dielectric layer 50. For example, the resultant structure including the dielectric layer 50 may be processed in an $O_3$ atmosphere, processed in a plasma atmosphere containing $O_2$ and/or $N_2$ and/or annealed in a gas atmosphere containing $O_2$ and/or $N_2$.

Figure 7:
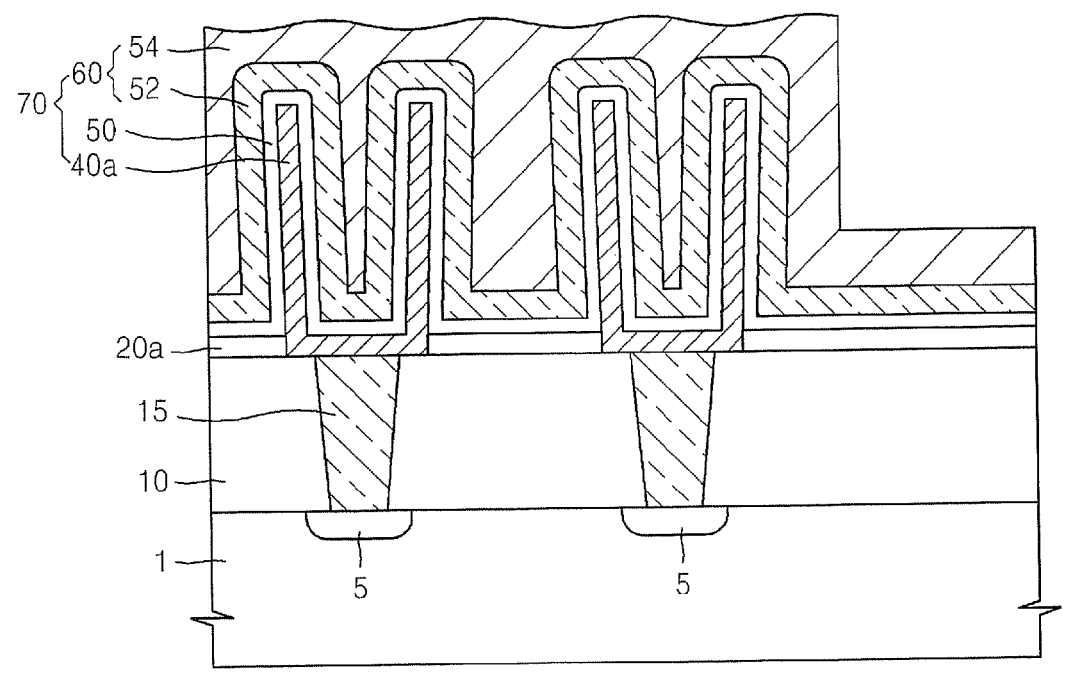

Referring to FIG. 7, an upper electrode 60 is formed on the dielectric layer 50. In this case, the upper electrode 60 is formed by sequentially stacking a TiN layer 52 and an n-type or p-type doped poly-$Si_{1-x}Ge_x$ layer 54 wherein 0<x<1.

Initially, the TiN layer 52 may be formed using a CVD process, an ALD process and/or a metal organic CVD (MOCVD) process. The TiN layer 52 may be replaced by a layer formed of WN, TaN, Cu, Al and/or W. Alternatively, the TiN layer 52 may be replaced by a noble metal layer formed of Pt, Ir, Ru, Rh, Os, Pd and/or an oxide thereof. Alternatively, the TiN layer 52 may be replaced by a metal combination layer formed of, for example, TiN/W, TiN/TaN and/or WN/W. The above-described layers that may replace the TiN layer 52 may be deposited at below 500° C.

Thereafter, an n-type or p-type doped poly-$Si_{1-x}Ge_x$ layer 54 is formed on the TiN layer 52. The doped poly-$Si_{1-x}Ge_x$ layer 54 may be formed by doping impurity ions in-situ. To form the n-type or p-type doped poly-$Si_{1-x}Ge_x$ layer 54 using an in-situ process, a furnace-type chamber for performing an ordinary LPCVD process, a single-wafer-type chamber and/or a mini-batch-type chamber capable of accommodating 25 wafers may be employed. The in-situ process may be replaced or supplemented by a two-step process including depositing a poly-$Si_{1-x}Ge_x$ layer followed by doping impurity ions.

The poly-$Si_{1-x}Ge_x$ layer may be formed using a source gas of $SiH_4$, $Si_2H_6$, $SiH_2Cl_2$, $GeH_4$ and/or $GeH_4$, at 550° C. or lower, for example, between 400° C. and 550° C. For instance, the poly-$Si_{1-x}Ge_x$ layer may be formed at a temperature of 430° C. To form the poly-$Si_{1-x}Ge_x$ layer, an amorphous $Si_{1-x}Ge_x$ (a-$Si_{1-x}Ge_x$) layer may be deposited and crystallized into the poly-$Si_{1-x}Ge_x$ layer using an annealing process for activation. Alternatively, an activated poly-$Si_{1-x}Ge_x$ layer may be formed initially. However, since the a-$Si_{1-x}Ge_x$ layer is formed on the TiN layer 52, which is a crystalline layer, the a-$Si_{1-x}Ge_x$ layer is easily crystallized during a deposition process if the a-$Si_{1-x}Ge_x$ layer is not deposited at too low a temperature. According to experiments conducted by the present inventor(s), a $Si_{1-x}Ge_x$ layer was crystallized at a temperature close to 425° C., for example, 420° C., so that no subsequent annealing process was needed. An a-$Si_{1-x}Ge_x$ layer may be deposited at below 400° C., for example, at 350° C. to 400° C., and a subsequent annealing process may be performed at below 550° C., for example, at 400° C. to 550° C.

In order to form an n-type doped poly-$Si_{1-x}Ge_x$ layer, while depositing a poly-$Si_{1-x}Ge_x$ layer, P ions and/or As ions may be doped into the poly-$Si_{1-x}Ge_x$ layer in-situ. Also, a p-type doped poly-$Si_{1-x}Ge_x$ layer may be formed by doping B ions into a poly-$Si_{1-x}Ge_x$ layer in-situ while depositing the poly-$Si_{1-x}Ge_x$ layer. A $BCl_3$ source and/or a $B_2H_6$ source may be used as a B doping source. Since the $Si_{1-x}Ge_x$ layer is doped with impurity ions in order to provide high resistivity, the dopant concentration may be determined in consideration of the desired resistivity. For example, n-type impurity ions, such as P ions and/or As ions, may be doped at a concentration of approximately $3 \times 10^{20}/cm^3$, while p-type impurity ions, such as B ions, may be doped at a concentration of $1 \times 10^{20}/cm^3$ or higher. When the $Si_{1-x}Ge_x$ layer is deposited at less than 400° C., the resultant structure including the $Si_{1-x}Ge_x$ layer may be annealed to activate the doped impurity ions. However, the annealing process may be performed at 550° C. or lower, unlike a conventional case. Thus, a capacitor 70 including the lower electrode 40a, the dielectric layer 50, and the upper electrode 60 is fabricated at comparatively low temperature(s) of 550° C. or lower. As a result, the leakage current of the capacitor can be reduced.

A content ratio "x" of Si to Ge may be controlled using a gas flow ratio. The content ratio "x" is not restricted to a specific value, but is set along with dopant concentrations such that a $Si_{1-x}Ge_x$ layer has such an appropriate work function as not to form a depletion layer. For example, when the foregoing n-type dopant concentration is used, $0.05 \leq x \leq 0.9$ may be provided, and when the foregoing p-type dopant concentration is used, $0.1 \leq x \leq 0.9$ may be provided. In both cases, the content ratio "x" is controlled to satisfy $0.2 \leq x \leq 0.6$. In particular, when the p-type impurity ions are used, the content ratio "x" may be controlled to be 0.5. The content ratio "x" may be set in consideration of resistivity, deposition rate, surface morphology and/or deposition temperature.

Since $Si_{1-x}Ge_x$ has a lower melting point than silicon (Si), physical processes such as deposition, crystallization, grain growth and/or impurity activation may be performed on $Si_{1-x}Ge_x$ at lower temperatures than on Si. Some embodiments of the present invention make the most of this characteristic and adopt a doped poly-$Si_{1-x}Ge_x$ layer instead of a conventional poly-Si layer to form an upper electrode. As a result, the entire process can be formed at 550° C. or lower, which can greatly improve the leakage current of the MIS capacitor.

Although the above embodiments described only a MIS capacitor, embodiments of the present invention are not limited thereto. Thus, embodiments of the present invention can be applied to a metal-insulator-metal (MIM) capacitor including a lower electrode formed of a metal layer and an upper electrode formed of the TiN layer 52 and the n-type or p-type doped poly-$Si_{1-x}Ge_x$ layer 54 as described above. As stated above, the lower electrode may be formed by depositing a TiN layer, a WN layer, a TaN layer, a Cu layer and/or a W layer on a mold oxide layer pattern using a CVD process, an ALD process and/or an MOCVD process, and planarizing the metal layer. In addition, the lower electrode may be formed of other metal layers, for example, a noble metal layer formed of Pt, Ir, Ru, Rh, Os, Pd and/or an oxide thereof, or a metal combination layer formed of TiN/W, TiN/TaN and/or WN/W. In this case, the dielectric layer may be an $HfO_2$ layer, an $Al_2O_3$ layer, an $Al_2O_3/HfO_2$ layer, an $HfO_2/Al_2O_3$ layer, a $ZrO_2$ layer, a $ZrO_2/Al_2O_3$ layer, a lanthanide oxide layer, a $SrTiO_3$ layer, and/or a $(Ba, Sr)TiO_3$ layer. Like in the above-described embodiments, an upper electrode is formed using a doped poly-$Si_{1-x}Ge_x$ layer instead of a conventional poly-Si layer so that the MIM capacitor can be fabricated at 550° C. or less. Embodiments of the invention also may be used to form semiconductor interconnection structures of general application.

In some embodiments of the present invention, the upper electrode 60 may be formed of only an n-type or p-type doped poly-$Si_{1-x}Ge_x$ layer. Likewise, the doped poly-$Si_{1-x}Ge_x$ layer may be formed such that $0.2 \leq x \leq 0.6$.

In this case, the lower electrode 40a of the capacitor 70 may be formed of a metal layer. In addition to TiN, the lower electrode 40a may be formed of a metal such as WN, TaN, Cu, Al and/or W, a noble metal such as Pt, Ir, Ru, Rh, Os, Pd and/or an oxide thereof, or a combination, such as TiN/W, TiN/TaN and/or WN/W.

Figure 8:
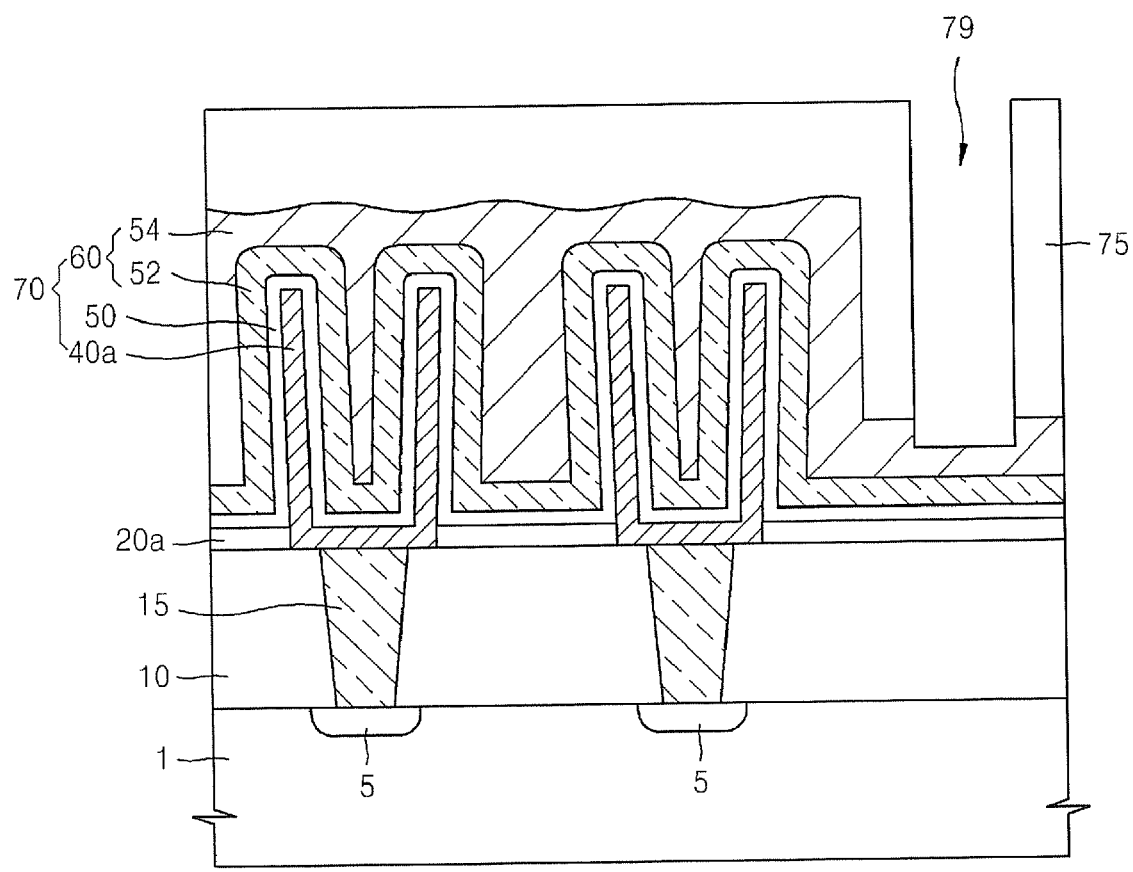

Referring to FIG. 8, an interlayer insulating layer 75 is deposited to a great thickness on the entire surface of the substrate 1 including the upper electrode 60, and the surface of the resultant structure is planarized using an etchback process and/or a CMP process. In some embodiments, the interlayer insulating layer 75 is a PE-TEOS layer. However, embodiments of the present invention are not limited thereto and the interlayer insulating layer 75 may be a BPSG layer, a PSG layer and/or an HDP oxide layer.

Referring to FIG. 8, the interlayer insulating layer 75 is etched to form a contact hole 79 exposing the upper electrode 60. The formation of the contact hole 79 includes forming a mask or photoresist pattern on the interlayer insulating layer 75 to define the contact hole 79, and wet and/or dry etching the interlayer insulating layer 75 using the mask or photoresist pattern as an etch mask. An etching process for forming the contact hole 79 may be performed until the surface of the interlayer insulating layer 75 is exposed or until the interlayer insulating layer 75 is overetched to a predetermined depth. After the etching process is finished, ordinary ashing and stripping processes may be performed to clean the inside of the contact hole 79. In this case, the stripping process may be conducted using an ordinary amine organic stripper.

Figure 9:
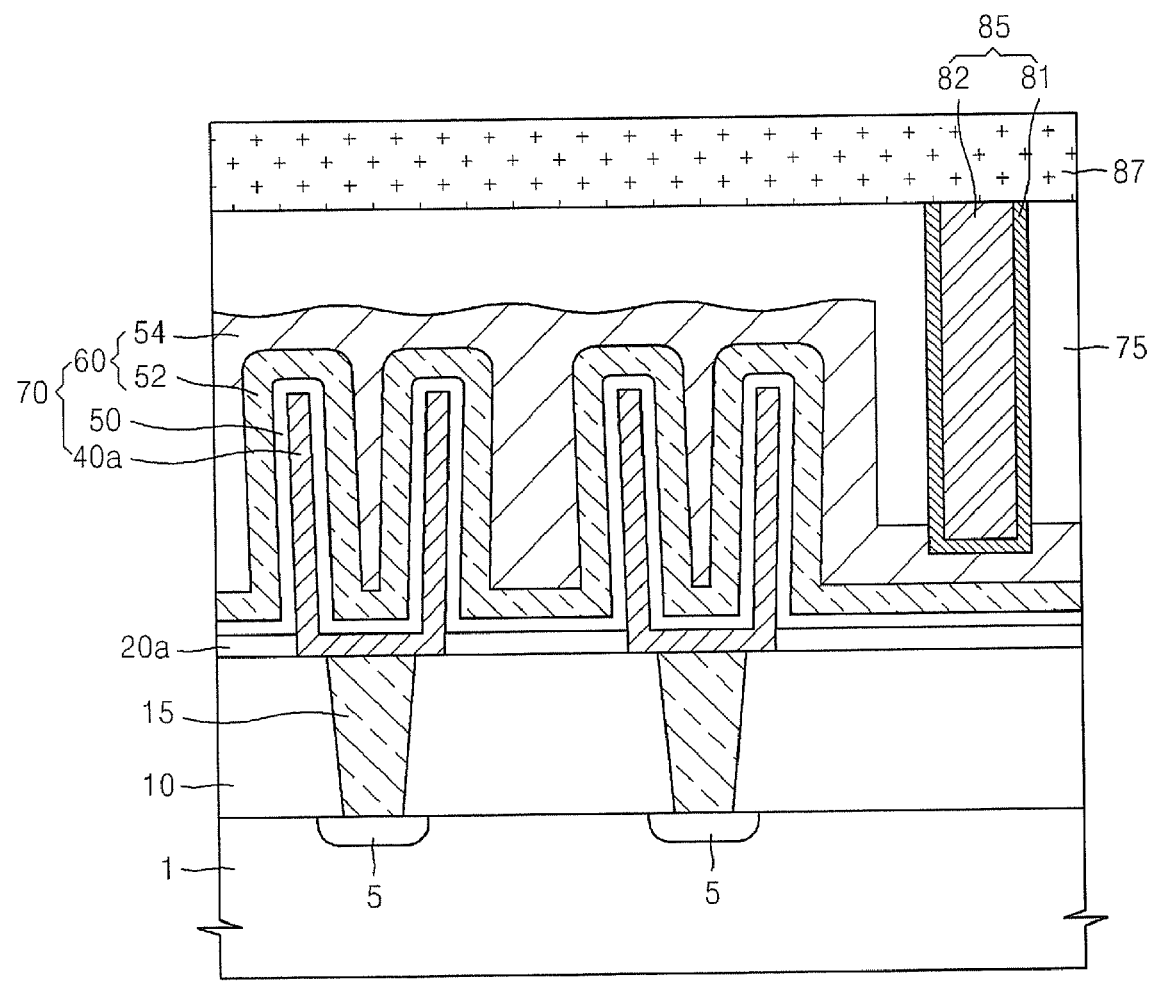

Thereafter, as shown in FIG. 9, the contact hole 79 is provided with a metal layer to form a metal contact plug 85. The metal contact plug 85 is brought into contact with the doped poly-$Si_{1-x}Ge_x$ layer 54 of the upper electrode 60. For example, a barrier metal layer 81, such as a Ti/TiN layer, is formed on an inner wall of the contact hole 79, and the contact hole 79 is filled with a W layer 82 to form the metal contact pug 85. In this case, the metal contact plug 85 may extend into the doped poly-$Si_{1-x}Ge_x$ layer 54 by a predetermined depth as illustrated in FIG. 9.

Subsequently, a conductive interconnection layer 87 is formed on the entire surface of the substrate 1 having the metal contact plug 85 including remote from the metal contact plug 85. The interconnection layer 87 may be formed of a metal layer, such as an Al layer and/or other conductive layer. Thus, the upper electrode 60 is electrically connected to the metal interconnection layer 87, which may be connected to an external terminal, by the metal contact plug 85.

It will be understood by those having skill in the art that the poly-$Si_xGe_{1-x}$ layer(s) described herein may include the value(s) or range(s) of x described herein over their entire extent or only in a portion thereof. For example, a given value or range of x may be uniform throughout the layer or only may be present in a portion of the layer, for example, a portion adjacent a metal contact plug or in an opening in a dielectric layer.

The present invention will now be described in more detail with reference to the following experimental examples. The following Examples shall be regarded as merely illustrative and shall not be construed as limiting the invention.

EXPERIMENTAL EXAMPLE 1

In order to form an upper electrode of a capacitor according to some embodiments of the present invention, while depositing a poly-$Si_{1-x}Ge_x$ layer at a temperature of 500° C. under a pressure of 275 Torr using a single-wafer-type chamber, P ions were doped in-situ. $SiH_4$ and $GeH_4$ were used as source gases. In this case, the poly-$Si_{1-x}Ge_x$ layer was deposited for 4 to 5 minutes while varying the flow rate of $GeH_4$. $GeH_4$ was diluted with hydrogen or nitrogen at a ratio of 1:10 (and thus hereinafter referred to as 10% $GeH_4$). P ions were doped at a concentration of $3\times10^{20}/cm^3$, and no additional annealing process was performed on the resulting n-type doped poly-$Si_{1-x}Ge_x$ layer.

Figure 10:
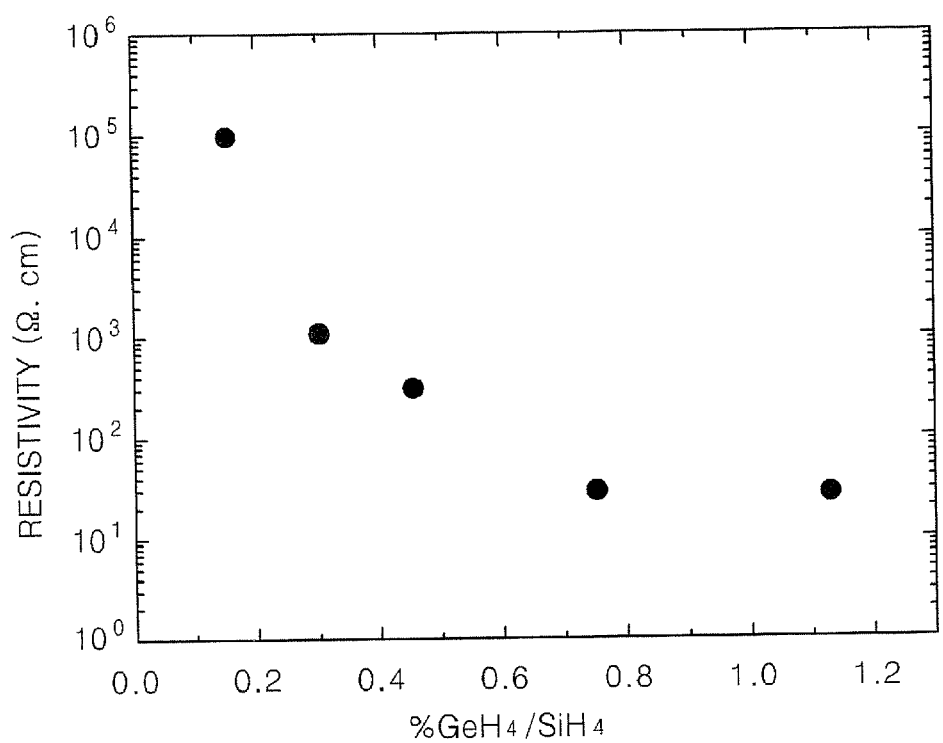
FIG. 10 is a graph of resistivity relative to the flow rate of $GeH_4$ in an in-situ n-type doped polysilicon germanium (poly-$Si_{1-x}Ge_x$) layer.

FIG. 10 is a graph of resistivity relative to the flow rate of $GeH_4$ in the in-situ n-type doped poly-$Si_{1-x}Ge_x$ layer. In FIG. 10, the abscissa denotes the ratio of 10% $GeH_4$ to $SiH_4$, and the ordinate denotes the resistivity of the in-situ n-type doped poly-$Si_{1-x}Ge_x$ layer. As can be seen from FIG. 10, the resistivity of the in-situ n-type doped poly-$Si_{1-x}Ge_x$ layer decreased with a rise in the flow rate of 10% $GeH_4$. Based on the resistivity of FIG. 10, it can be confirmed that the in-situ n-type doped poly-$Si_{1-x}Ge_x$ layer was deposited and activated at the same time under deposition conditions where the process temperature was 500° C. and the process pressure was 275 Torr.

Therefore, when the in-situ n-type doped poly-$Si_{1-x}Ge_x$ layer is deposited using $SiH_4$ and $GeH_4$ source gases at a temperature of 500° C. under a process pressure of 275 Torr, a subsequent annealing process for activation may be omitted, unlike in a conventional case. It is reported that during the deposition of Si, the temperature at which the transition from a-Si to poly-Si occurs decreases with pressure. Therefore, by adopting a low-pressure mini-batch-type chamber (4 Torr) or a furnace-type LPCVD chamber (1 Torr or lower) instead of a single-wafer-type chamber, an in-situ n-type doped poly-$Si_{1-x}Ge_x$ layer may be deposited at a lower temperature.

EXPERIMENTAL EXAMPLE 2

A poly-Si layer was formed using an ALD process to form a cylindrical lower electrode, and $PH_3$ ions were doped into an upper portion of the cylindrical lower electrode to form a doped poly-Si lower electrode. A plasma nitridation process using $NH_3$ gas was performed on the surface of the doped poly-Si lower electrode. The plasma nitridation process was performed at a temperature of 790° C. with a radio-frequency (RF) power of 300 W for 20 seconds, to obtain a silicon nitride layer having a thickness of 16 Å. An $HfO_2$ dielectric layer was deposited to a thickness of 45 Å on the resultant structure. The $HfO_2$ layer was formed using $Hf(NEtMe)_4$, which is called TEMAH, and $O_3$ as source gases, by ALD, by bubbling Ar at a temperature of 300° C.

Thereafter, a TiN layer was formed on the $HfO_2$ layer at a temperature of 450° C. by ALD. The TiN layer was deposited using $TiCl_4$ and $NH_3$ as source gases at a temperature below 500° C. An in-situ n-type doped poly-$Si_{1-x}Ge_x$ layer was stacked on the resultant structure under the following conditions, so that an upper electrode formed of the TiN layer and the in-situ doped poly-$Si_{1-x}Ge_x$ layer was completed.

While depositing the poly-$Si_{1-x}Ge_x$ layer using a single-wafer-type chamber at a temperature of 470° C. under a pressure of 275 Torr, P ions were doped in-situ at a concentration of $3\times10^{20}/cm^3$. $SiH_4$ and $GeH_4$ were used as source gases, and the poly-$Si_{1-x}Ge_x$ layer was deposited using a two-step process including a seeding process and a main deposition process.

During the seeding process, $SiH_4$ was supplied without $GeH_4$ at a flow rate of 50 sccm for 50 seconds. In this case, 1%-diluted $PH_3$ (hereinafter, 1% $PH_3$) was supplied as a P doping source at a flow rate of 6 sccm. $N_2$ was supplied as a carrier gas at a flow rate of 9000 sccm. During the main deposition process, $SiH_4$ was supplied at an increased flow rate of 80 sccm, and 10% $GeH_4$ was supplied at a flow rate of 240 sccm. 1% $PH_3$ and $N_2$ were supplied at the same flow rates as in the seeding process. The main deposition process was performed for 110 seconds. As a result, a content ratio "x" of Si to Ge became 0.2. $PH_3$ and $GeH_4$ were diluted with hydrogen or nitrogen. No additional annealing process was performed on the resulting n-type doped poly-$Si_{1-x}Ge_x$ layer.

Figure 11:
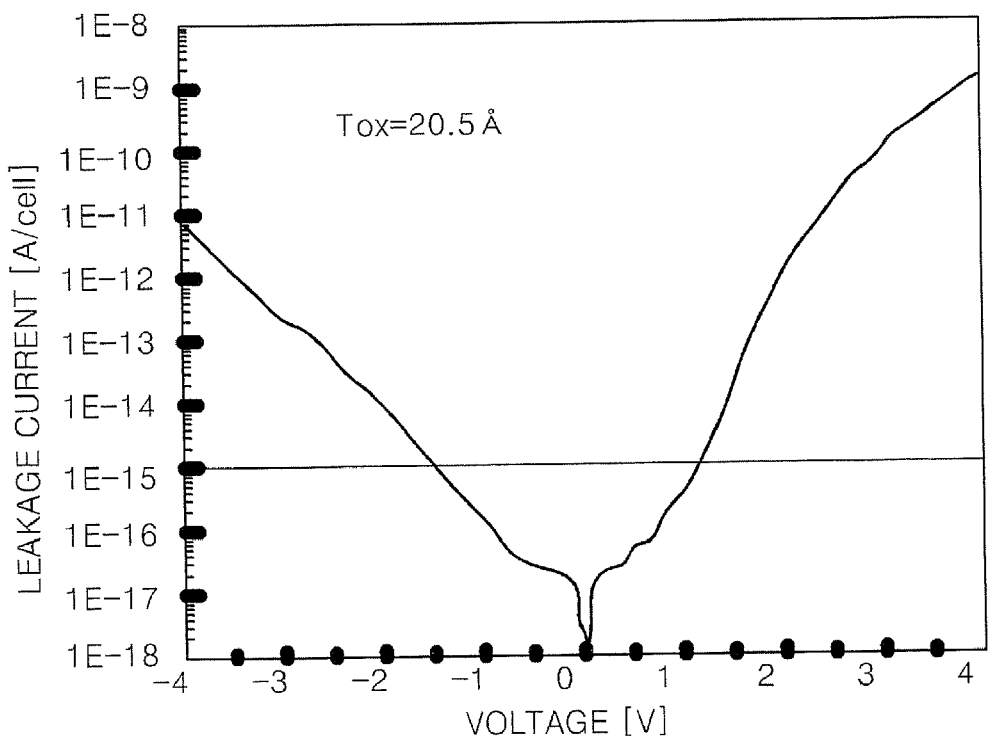
FIG. 11 is a graph of the cell leakage current of an MIS capacitor fabricated according to some embodiments of the present invention.

FIG. 11 is a graph of the cell leakage current of an MIS capacitor fabricated using the method according to Experimental example 2. Referring to FIG. 11, it can be confirmed that the leakage current of the capacitor was far lower than in case (b) of FIG. 1, and about the same as in case (a) of FIG. 1. Also, the gate oxide thickness (Tox) was 20.5 Å, which was about the same as in case (a) of FIG. 1. Thus, it can be seen that the n-type doped poly-$Si_{1-x}Ge_x$ layer functioning as an upper electrode can be obtained without performing an additional annealing process.

Almost the same excellent results as described above could be obtained when a poly-$Si_{1-x}Ge_x$ layer was deposited and doped with P ions in-situ using an LPCVD furnace at a temperature of 470° C. under a pressure of 0.45 Torr for 65 minutes.

EXPERIMENTAL EXAMPLE 3

A capacitor was fabricated under conditions similar to those in Experimental example 2 except that an $HfO_2$ layer was deposited under various conditions to obtain various gate oxide thicknesses Tox. For comparison with the result of the present invention, a conventional capacitor using as an upper electrode a double layer including a TiN layer and an n-type doped poly-Si layer that was annealed at a temperature of 600° C. for 30 minutes was fabricated as in case (b) of FIG. 1.

Figure 12:
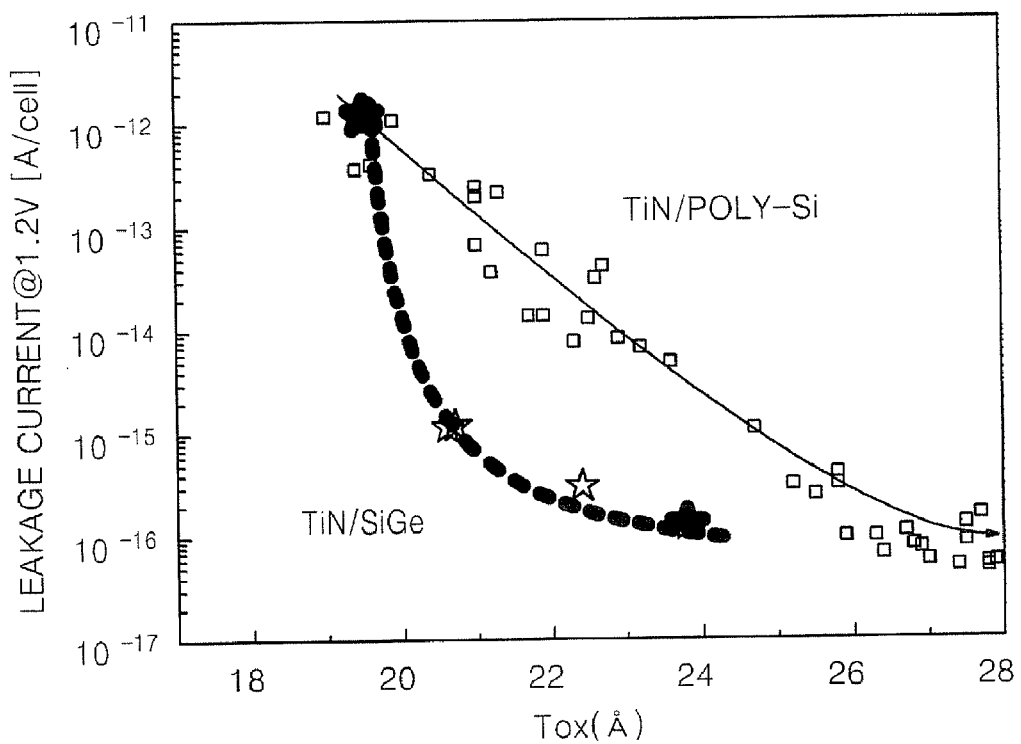
FIG. 12 is a graph of a cell leakage current relative to gate oxide thickness (Tox) in a conventional MIS capacitor and an MIS capacitor fabricated according to some embodiments of the present invention.

FIG. 12 is a graph of a cell leakage current relative to gate oxide thickness Tox in the conventional capacitor and the capacitor fabricated according to these embodiments of the present invention. In FIG. 12, the result of the capacitor according to these embodiments of the present invention is illustrated with a dotted line, and the result of the conventional capacitor as in case (b) of FIG. 1 is illustrated with a solid line.

As can be seen from FIG. 12, the leakage current of the capacitor according to these embodiments of the present invention was less than that of the conventional capacitor for the same gate oxide thickness Tox. Also, the gate oxide thickness Tox was less in these embodiments of the present invention than in the conventional case for the same leakage current. Therefore, according to these embodiments of the present invention, both the leakage current and gate oxide thickness Tox can be less than in the conventional case, so that a capacitor having excellent characteristics can be fabricated.

EXPERIMENTAL EXAMPLE 4

An in-situ p-type doped poly-$Si_{1-x}Ge_x$ layer functioning as an upper electrode of a capacitor according to some embodiments of the present invention was formed. While depositing a poly-$Si_{1-x}Ge_x$ layer using an LPCVD process in a furnace-type chamber at a temperature of 425° C. under a pressure of 1 Torr or less, B ions were doped in-situ. In this case, $SiH_4$ and $GeH_4$ were used as source gases, and $BCl_3$ was used as a B doping source. The B ions were doped at a concentration of $1\times10^{21}/cm^3$. The poly-$Si_{1-x}Ge_x$ layer was formed such that a content ratio "x" had two different values, 0.2 and 0.5. In other words, a poly-$Si_{0.8}Ge_{0.2}$ layer and a poly-$Si_{0.5}Ge_{0.5}$ layer were formed. In order to compare with the results of these embodiments of the present invention, a conventional n-type doped poly-Si layer was deposited at a temperature of 530° C. $PH_3$ was used as a doping source, and a dopant concentration was $3\times10^{20}/cm^3$. No additional annealing process for activation was performed on the deposited in-situ p-type doped poly-$Si_{1-x}Ge_x$ layer and conventional n-type doped poly-Si layer. The experimental conditions and estimated data of the in-situ p-type doped poly-$Si_{1-x}Ge_x$ layer and conventional n-type doped poly-Si layer are arranged in Table 1.

TABLE 1

|  | n-type doped poly-Si layer | In-situ p-type doped poly-$Si_{0.8}Ge_{0.2}$ layer | In-situ p-type doped poly-$Si_{0.5}Ge_{0.5}$ layer |
|---|---|---|---|
| Type of chamber | LPCVD furnace | LPCVD furnace | LPCVD furnace |
| Deposition temperature (° C.) | 530 | 425 | 425 |
| Maximum surface resistance (Ω/square) | — | 1955 | 237.8 |
| Minimum surface Resistance (Ω/square) | — | 981 | 110.1 |
| Surface Resistance (Ω/square) | — | 1547 | 128.0 |

Although the conventional n-type doped poly-Si layer was deposited at a temperature 105° C. higher than the in-situ p-type doped poly-$Si_{1-x}Ge_x$ layer, the surface resistance of the conventional n-type doped poly-Si layer exceeded the measurement limit. In comparison, the in-situ p-type doped poly-$Si_{0.8}Ge_{0.2}$ layer and the in-situ p-type doped poly-$Si_{0.5}Ge_{0.5}$ layer exhibited comparatively low surface resistances. In particular, the in-situ p-type doped poly-$Si_{0.5}Ge_{0.5}$ layer with a higher Ge content, which was deposited at a low temperature of 425° C. and did not undergo any additional annealing process, had a low surface resistance of 128 Ω/square. Therefore, it can be concluded that the in-situ p-type doped poly-$Si_{0.5}Ge_{0.5}$ layer is suitable for an upper electrode of a capacitor.

EXPERIMENTAL EXAMPLE 5

In order to form an upper electrode of a capacitor according to some embodiments of the present invention, a TiN layer was deposited on a dielectric layer, and then while depositing a poly-$Si_{1-x}Ge_x$ layer on the TiN layer, B ions were doped in-situ to form a p-type doped poly-$Si_{1-x}Ge_x$ layer. The poly-$Si_{1-x}Ge_x$ layer was deposited using an LPCVD process in a furnace-type chamber at a temperature of 425° C. under a pressure of 1 Torr or less, and the remaining deposition conditions were the same as in Experimental example 1. However, in this example, the in-situ p-type doped poly-$Si_{1-x}Ge_x$ layer was formed on the TiN layer instead of the dielectric layer. For comparison with the results of these embodiments of the present invention, a conventional n-type doped poly-Si layer was deposited on a TiN layer at a temperature of 530° C. No annealing process for activation was performed on the in-situ p-type doped poly-$Si_{1-x}Ge_x$ layer according to these embodiments of the present invention, but an annealing process for activation was performed on the conventional n-type doped poly-Si layer under various conditions. The experimental conditions and estimated data of the in-situ p-type doped poly-$Si_{1-x}Ge_x$ layer and conventional n-type doped poly-Si layer are arranged in Table 2.

TABLE 2

|  | TiN layer/n-type doped poly-Si layer | | | | TiN layer/In-situ p-type doped poly-Si$_{0.8}$Ge$_{0.2}$ layer | TiN layer/In-situ p-type doped poly-Si$_{0.5}$Ge$_{0.5}$ layer |
| --- | --- | --- | --- | --- | --- | --- |
| Type of chamber | LPCVD furnace | | | | LPCVD furnace | LPCVD furnace |
| Deposition temperature (° C.) | 530 | | | | 425 | 425 |
| Deposition rate (Å/min.) | 10 | | | | 19 | 27 |
| Deposition time (min.) | 180 | | | | 94 | 66 |
| Annealing for activation | x | 550° C. 30 min. | 580° 30 min. | 600° 30 min. | x | x |
| Maximum surface resistance ('Ω/square) | 100.5 | 99.6 | 74.2 | 32.8 | 137.9 | 61.9 |
| Minimum surface resistance ('Ω/square) | 79.8 | 80.2 | 71 | 31.1 | 112.7 | 57.0 |
| Surface resistance ('Ω/square) | 89.5 | 87.3 | 72.4 | 31.9 | 128.0 | 59.8 |

As can be seen from Table 2, it was estimated that the deposition rate of the in-situ p-type doped poly-Si$_{0.8}$Ge$_{0.2}$ layer was 19 Å/min. and the in-situ p-type doped poly-Si$_{0.5}$Ge$_{0.5}$ layer was 27 Å/min. Thus, it took 94 minutes to deposit the in-situ p-type doped poly-Si$_{0.8}$Ge$_{0.2}$ layer to a thickness of 1800 Å, and it took 66 minutes to deposit the in-situ p-type doped poly-Si$_{0.5}$Ge$_{0.5}$ layer to a thickness of 1800 Å. Since the deposition rate of the conventional n-type doped poly-Si layer was 10 Å/min, it took 180 minutes to deposit the conventional n-type doped poly-Si layer to a thickness of 1800 Å. Therefore, it can be seen that when the upper electrode of the capacitor is formed using the p-type doped poly-Si$_{1-x}$Ge$_x$ layer according to these embodiments of the present invention, the process time can be greatly reduced.

Also, although the in-situ p-type doped poly-Si$_{0.5}$Ge$_{0.5}$ layer did not undergo an additional annealing process for activation, the in-situ p-type doped poly-Si$_{0.5}$Ge$_{0.5}$ layer could obtain similar results to the conventional n-type doped poly-Si layer on which an annealing process was performed at a temperature of 580° C. for 30 minutes or at a temperature of 600° C. for 10 minutes. In conclusion, even if the p-type doped poly-Si$_{1-x}$Ge$_x$ layer according to these embodiments of the present invention is deposited at a low temperature of 425° C., it is expected that the p-type doped poly-Si$_{1-x}$Ge$_x$ layer can be activated during the deposition process. Therefore, the p-type doped poly-Si$_{1-x}$Ge$_x$ layer can be formed at a temperature 105° C. lower than in the conventional case. As a result, according to the present invention, the p-type doped poly-Si$_{1-x}$Ge$_x$ layer can be deposited in a short time at a low temperature, so that a thermal budget applied to the capacitor can be reduced.

EXPERIMENTAL EXAMPLE 6

Figure 13:
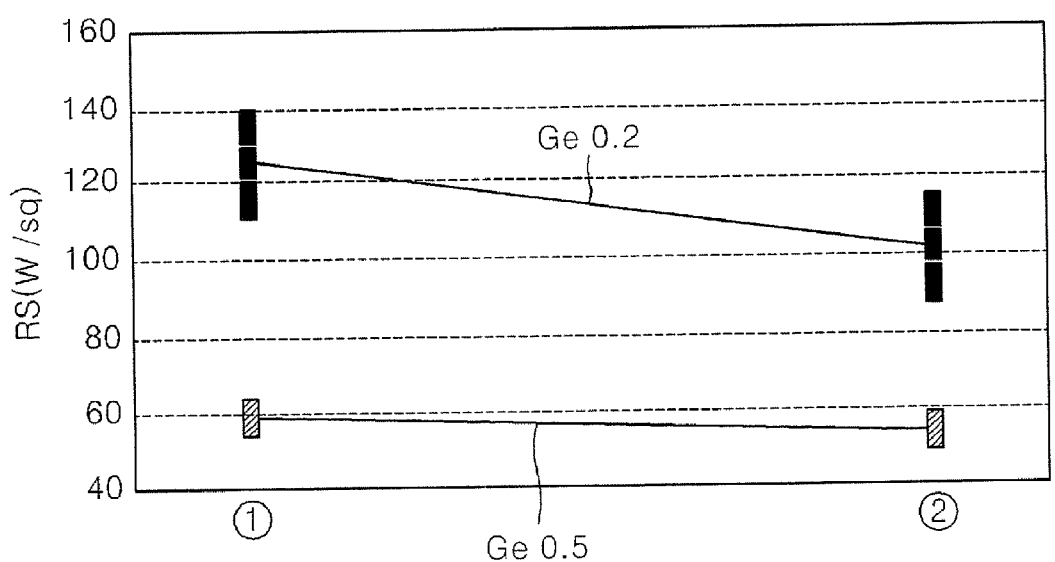
FIG. 13 is a graph of resistance when an annealing process for activation was performed on each of an in-situ p-type doped poly-$Si_{0.8}Ge_{0.2}$ layer and an in-situ p-type doped poly-$Si_{0.5}Ge_{0.5}$ layer, which are deposited according to some embodiments of the present invention.

FIG. 13 is a graph of resistance when an annealing process for activation was performed on the in-situ p-type doped poly-Si$_{0.8}$Ge$_{0.2}$ layer and the in-situ p-type doped poly-Si$_{0.5}$Ge$_{0.5}$ layer that were deposited as described above. In FIG. 13, the abscissa denotes whether an annealing process for activation is performed or not, and the ordinate denotes surface resistance. In FIG. 13, ① shows a case where each of the in-situ p-type doped poly-Si$_{0.8}$Ge$_{0.2}$ layer and the in-situ p-type doped poly-Si$_{0.5}$Ge$_{0.5}$ layer was deposited, ② shows a case where an annealing process was performed on each of the in-situ p-type doped poly-Si$_{0.8}$Ge$_{0.2}$ layer and the in-situ p-type doped poly-Si$_{0.5}$Ge$_{0.5}$ layer at a temperature of 530° C. for 30 minutes. As can be seen from FIG. 13, the in-situ p-type doped poly-Si$_{0.8}$Ge$_{0.2}$ layer with a lower Ge content as deposited had a surface resistance of 120 Ω/square and the in-situ p-type doped poly-Si$_{0.5}$Ge$_{0.5}$ layer with a higher Ge content as deposited had a surface resistance of 60 Ω/square. Thus, it is estimated that as the Ge content of the in-situ p-type doped poly-Si$_{1-x}$Ge$_x$ layer increases, its surface resistance decreases to some extent.

Also, after the annealing process for activation was performed, the surface resistance of the in-situ p-type doped poly-Si$_{0.8}$Ge$_{0.2}$ layer was greatly reduced, to 100 Ω/square, while the surface resistance of the in-situ p-type doped poly-Si$_{0.5}$Ge$_{0.5}$ layer exhibited only an insignificant decrease. Therefore, it is expected that the in-situ p-type doped poly-Si$_{0.5}$Ge$_{0.5}$ layer deposited at a temperature of 425° C. has almost the same surface resistance as the in-situ p-type doped poly-Si$_{0.5}$Ge$_{0.5}$ layer on which an annealing process for activation is performed. In other words, it is estimated that the in-situ p-type doped poly-Si$_{0.5}$Ge$_{0.5}$ layer was simultaneously deposited and activated at a low temperature.

EXPERIMENTAL EXAMPLE 7

While depositing a poly-Si$_{1-x}$Ge$_x$ layer using an ordinary LPCVD chamber at temperatures of 450, 470, 490, and 520° C., P ions were doped in-situ. SiH$_4$ and GeH$_4$ were used as source gases. In this case, the poly-Si$_{1-x}$Ge$_x$ layer was deposited for 4 to 5 minutes by varying the flow rate of GeH$_4$. GeH$_4$ was diluted with hydrogen or nitrogen at a ratio of 1:10 to give 10% GeH$_4$. P ions were doped at a concentration of 3×10$^{20}$/cm$^3$, and no additional annealing process was performed on the resulting n-type doped poly-Si$_{1-x}$Ge$_x$ layer.

Figure 14:
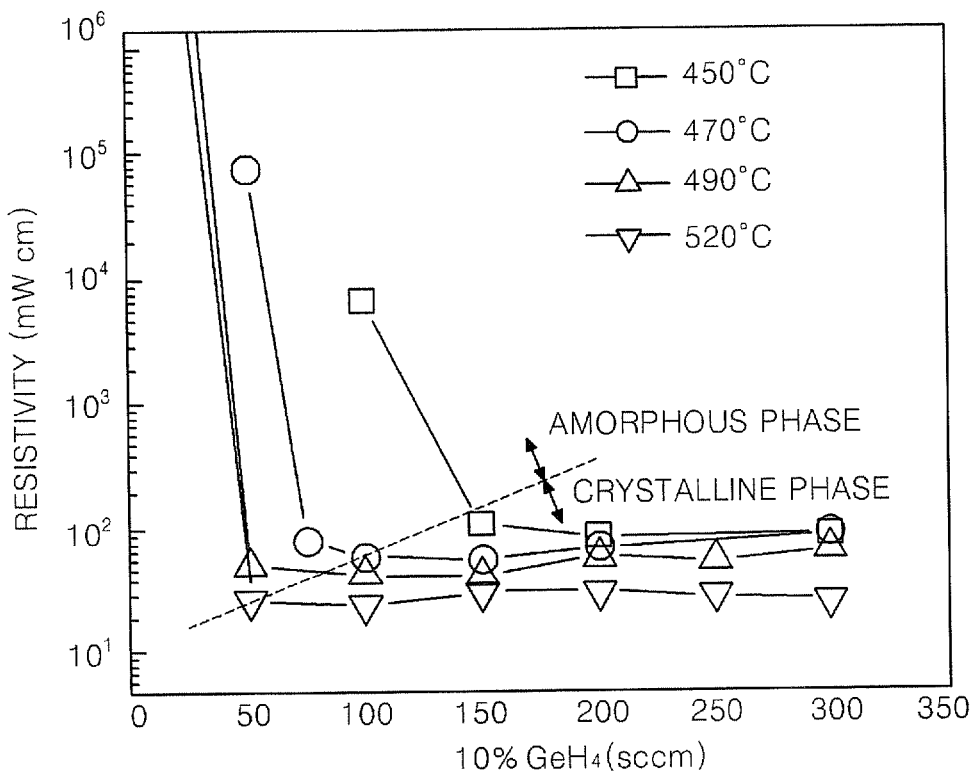
FIG. 14 is a graph of resistivity relative to the flow rate of $GeH_4$ of an n-type doped poly-$Si_{1-x}Ge_x$ layer deposited using a low-pressure chemical vapor deposition (LPCVD) process according to some embodiments of the present invention.

FIG. 14 is a graph of resistivity relative to the flow rate of GeH$_4$ in the n-type doped poly-Si$_{1-x}$Ge$_x$ layer deposited using an LPCVD process. In FIG. 14, the abscissa denotes the flow rate of 10% GeH$_4$, and the ordinate denotes the resistivity of the in-situ n-type doped poly-Si$_{1-x}$Ge$_x$ layer. As can be seen from FIG. 14, the resistivity of the in-situ n-type doped poly- $Si_{1-x}Ge_x$ layer decreased with a rise in the flow rate of 10% $GeH_4$. Considering that the in-situ n-type doped poly-$Si_{1-x}Ge_x$ layer had a stable resistivity at a low deposition temperature of 450° C., it can be seen that the in-situ n-type doped poly-$Si_{1-x}Ge_x$ layer was deposited and its dopant was activated at the same time, at a low temperature.

Meanwhile, as shown in FIG. 14, before the in-situ n-type doped poly-$Si_{1-x}Ge_x$ layer was crystallized, i.e. when a $Si_{1-x}Ge_x$ layer was in an amorphous phase, the resistivity of the $Si_{1-x}Ge_x$ layer sharply decreased as the Ge content of the $Si_{1-x}Ge_x$ layer increased, at each of the temperatures of 450, 470, 490, and 520° C. However, after the in-situ n-type doped poly-$Si_{1-x}Ge_x$ layer was crystallized, the resistivity of the $Si_{1-x}Ge_x$ layer hardly varied as the Ge content of the $Si_{1-x}Ge_x$ layer increased, at each of the temperatures of 450, 470, 490, and 520° C. For example, the poly-$Si_{1-x}Ge_x$ layer deposited at a temperature of 450° C. was crystallized when the poly-$Si_{1-x}Ge_x$ layer was formed of 40% by atoms of Ge, and the poly-$Si_{1-x}Ge_x$ layer as deposited at a temperature of 520° C. was crystallized when the poly-$Si_{1-x}Ge_x$ layer was formed of 15% by atoms of Ge. In other words, even if an additional annealing process for activation is not performed, a poly-$Si_{1-x}Ge_x$ layer deposited at a high temperature can be crystallized with a low Ge content, while a poly-$Si_{1-x}Ge_x$ layer deposited at a low temperature can be crystallized with a high Ge content. Therefore, a $Si_{1-x}Ge_x$ layer formed of 10% by atoms of Ge may be crystallized when it is deposited at a high temperature or when it is deposited at a low temperature and then annealed for activation.

EXPERIMENTAL EXAMPLE 8

Referring to the resultant structure described with reference to FIG. 8, a variation in the etched profile of the contact hole 79 for forming the metal contact plug 85 relative to the Ge content of the doped poly-$Si_{1-x}Ge_x$ layer was analyzed.

In the present experiment, an oxide layer was deposited to a thickness of 1000 Å on a silicon substrate, and a $Si_{1-x}Ge_x$ layer and a P-TEOS layer were deposited respectively to thicknesses of 2500 Å and 15000 Å, by varying the Ge content under the same process conditions as described with reference to FIG. 7. Thereafter, a mask pattern was formed to define a contact hole required for a metal contact plug, and a contact hole was formed using a dry etching process to expose the $Si_{1-x}Ge_x$ layer. Subsequently, ordinary ashing and stripping processes were performed. The stripping process was conducted using an amine organic stripper.

Figure 15:
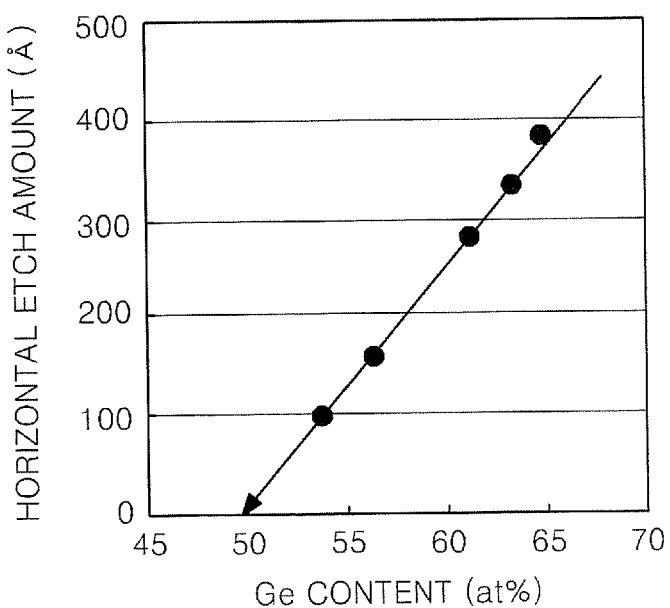
FIG. 15 is a graph of a horizontal etch amount relative to the Ge content of a poly-SiGe layer deposited according to some embodiments of the present invention.

FIG. 15 is a graph of a horizontal overetch amount measured around the bottom of the contact hole relative to the Ge content of the $Si_{1-x}Ge_x$ layer.

Referring to FIG. 15, it can be observed that the overetch amount increased with the Ge content, and the horizontal overetch amount was very small when the Ge content was 50 atomic % or less.

Figure 16:
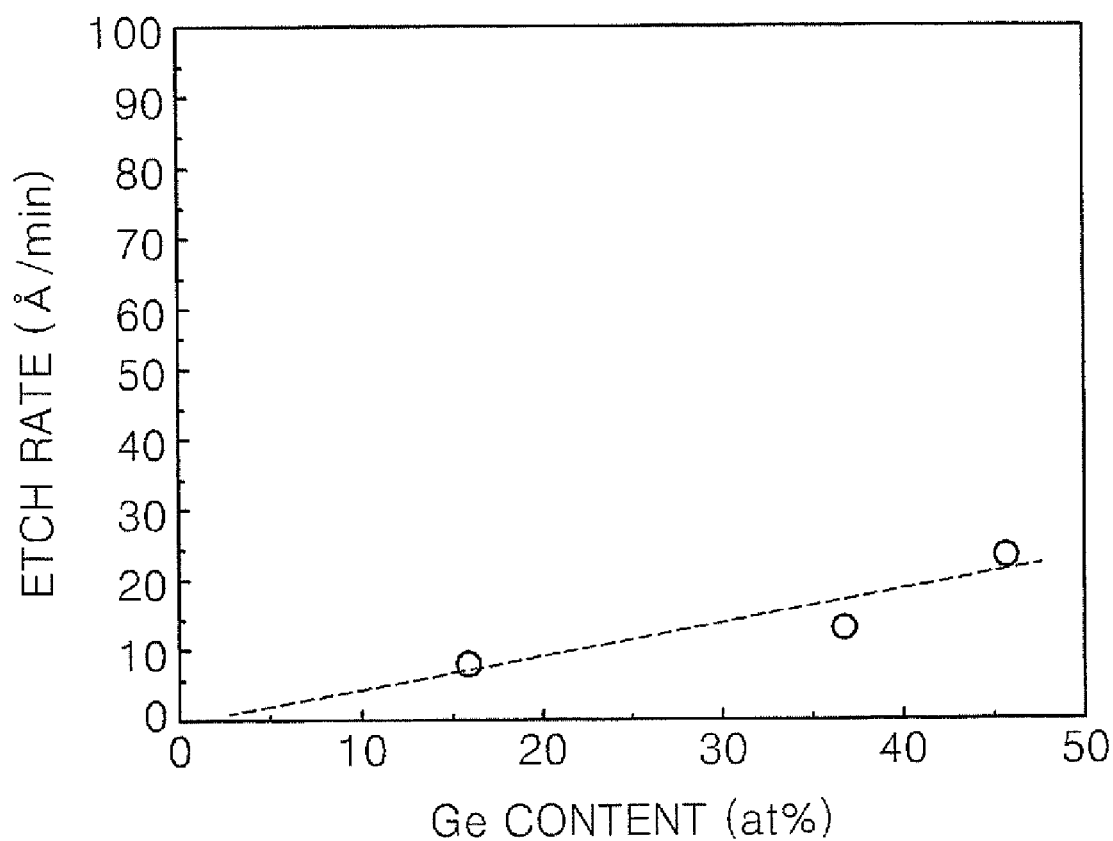
FIG. 16 is a graph of an etch rate relative to the Ge content of a poly-SiGe layer deposited according to some embodiments of the present invention.

FIG. 16 is a graph of an etch rate with respect to an organic stripper relative to the Ge content of the poly-$Si_{1-x}Ge_x$ layer.

Referring to FIG. 16, it can be observed that the etch rate of the poly-$Si_{1-x}Ge_x$ layer with respect to the organic stripper was very low. However, during a subsequent stripping process, horizontal overetching is likely to occur at the bottom of the contact hole due to plasma-induced damage caused during the process of etching the contact hole required for the metal contact plug. Also, it is expected that as the Ge content of the poly-$Si_{1-x}Ge_x$ layer increases, the horizontally overetch amount increases and the etched profile of the contact hole deteriorates.

Figure 17A:
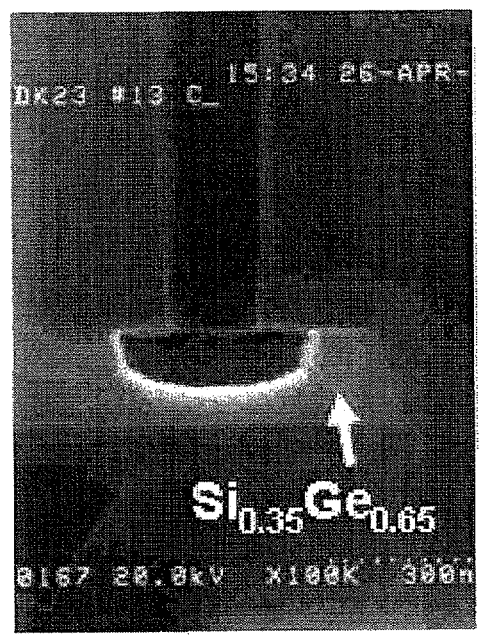
FIGS. 17A and 17B are vertical scanning electron microscope (VSEM) photographs showing the etched profiles of contact holes.
Figure 17B:
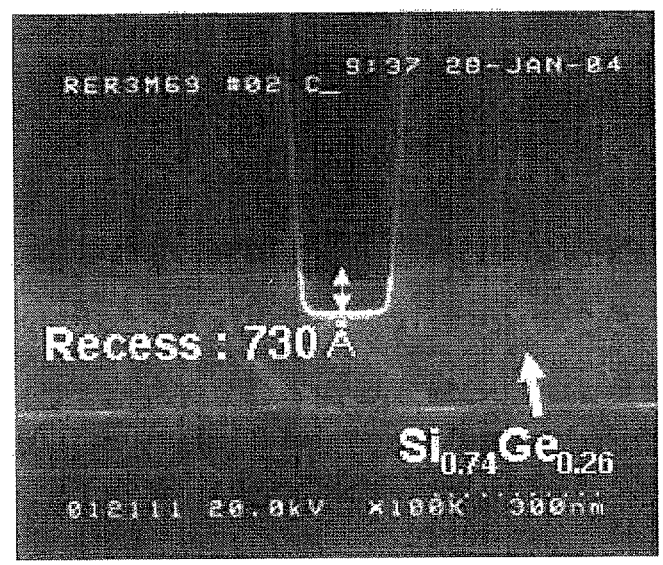

FIG. 17A is a vertical scanning electron microscope (VSEM) photograph showing the etched profile of a contact hole formed in a $Si_{0.35}Ge_{0.65}$ layer, and FIG. 17B is a VSEM photograph showing the etched profile of a contact hole formed in a $Si_{0.74}Ge_{0.26}$ layer.

As can be seen from FIGS. 17A and 17B, when a poly-SiGe layer was formed of 65% by atoms of Ge, the contact hole had a very poor etched profile, while when a poly-SiGe layer was formed of 26% by atoms of Ge, the contact hole had a very good etched profile. As the etched profile of the contact hole deteriorates, step coverage characteristics of a subsequently formed barrier metal layer (e.g. a Ti/TiN layer) and a metal layer (e.g. a W layer) worsens, and thus contact failures or contact resistance of the metal contact plug may increase.

On comparing FIGS. 14 and 15, it can be seen that a high Ge content helps form a poly-$Si_{1-x}Ge_x$ layer at a low temperature to reduce or prevent the degradation of a capacitor dielectric layer, while a low Ge content helps reduce or prevent the horizontal overetch amount of the contact hole. For this reason, the Ge content of the poly-$Si_{1-x}Ge_x$ layer may be appropriately controlled considering the trade-off between a low thermal budget and a small overetch amount at the bottom of a contact hole.

In some embodiments of the present invention, the Ge content of a $Si_{1-x}Ge_x$ layer used for an upper electrode of a capacitor is controlled to be 10 atomic % or more, for example, 15 atomic % or more, so that the $Si_{1-x}Ge_x$ layer can be deposited at a comparatively low temperature of 550° C. or lower, for example, 500° C. or lower. Also, the Ge content of the $Si_{1-x}Ge_x$ layer is controlled to be 70 atomic % or less, for example, atomic 60% or less, so that a horizontal overetch amount at the bottom of a contact hole can be within the allowable limit. FIG. 17 shows that the contact hole had a poor etched profile when the $Si_{1-x}Ge_x$ layer was formed of 65 atomic % of Ge. However, according to some embodiments of the present invention, even if the $Si_{1-x}Ge_x$ layer was formed of 70% or less by atoms of Ge, a good etched profile could be obtained by controlling conditions when a contact hole is formed.

According to some embodiments of the present invention as described above, an upper electrode is formed by stacking a metal layer, such as a TiN layer, and a doped poly-$Si_{1-x}Ge_x$ layer, so that a capacitor can be fabricated at a low temperature. Alternatively, a lower electrode is formed using a metal layer and an upper electrode is formed using a doped poly-$Si_{1-x}Ge_x$ layer, so that a capacitor can be fabricated at a low temperature. In this case, the doped poly-$Si_{1-x}Ge_x$ layer can be deposited in an activated state at 550° C. or lower, or activated at 550° C. or lower. Therefore, compared with a conventional capacitor fabrication process that uses a temperature of 600° C. or higher, a capacitor fabrication process according to some embodiments of the present invention can reduce or avoid degradation of a capacitor dielectric layer and markedly improve the leakage current of the capacitor.

Furthermore, according to some embodiments of the present invention, when a metal contact plug is formed to connect the upper electrode and a metal interconnection, the upper electrode can function as an etch stop layer during a process of etching a contact hole, so that the contact hole can have a good etched profile.

While the present invention has been particularly shown and described with reference to exemplary embodiments thereof, it will be understood by those of ordinary skill in the art that various changes in form and detail may be made therein without departing from the spirit and scope of the present invention as defined by the following claims. For example, the present embodiment illustrates only a cylindrical capacitor structure, but the present invention can be applied to various other capacitor structures, such as a concave capacitor or a stacked capacitor, or other semiconductor interconnection structures.

What is claimed is:

1. An integrated circuit capacitor, comprising:
   a lower capacitor electrode on a substrate;
   a capacitor dielectric layer on the lower capacitor electrode;
   an upper capacitor electrode directly on said capacitor dielectric layer, said upper capacitor electrode comprising a doped poly-$Si_{1-x}Ge_x$ layer, wherein $0.15 \leq x \leq 0.6$;
   an interlayer insulating layer directly on the doped poly-$Si_{1-x}Ge_x$ layer, said interlayer insulating layer having a contact hole therein aligned to a recess in the doped poly-$Si_{1-x}Ge_x$ layer; and
   a metal contact plug extending through the contact hole and into the recess; wherein a depth of the recess in the doped poly-$Si_{1-x}Ge_x$ layer is greater than 200 Å.

2. The integrated circuit capacitor of claim 1, wherein a lateral cross-sectional width of the recess at a bottom thereof is less than a corresponding lateral cross-sectional width of the contact hole at an interface between said interlayer insulating layer and the doped poly-$Si_{1-x}Ge_x$ layer.

3. The integrated circuit capacitor of claim 2, where x is about 0.26.

4. The integrated circuit capacitor of claim 1, where x is about 0.26.

* * * * *